United States Patent
Abts et al.

(10) Patent No.: US 8,245,087 B2
(45) Date of Patent: Aug. 14, 2012

(54) MULTI-BIT MEMORY ERROR MANAGEMENT

(75) Inventors: Dennis C. Abts, Eleva, WI (US);
Michael Higgins, Eau Claire, WI (US);
Van L. Snyder, Blaine, MN (US)

(73) Assignee: Cray Inc., Seattle, WA (US)

( * ) Notice: Subject to any disclaimer, the term of this patent is extended or adjusted under 35 U.S.C. 154(b) by 1231 days.

(21) Appl. No.: 11/693,572

(22) Filed: Mar. 29, 2007

(65) Prior Publication Data
US 2010/0185897 A1 Jul. 22, 2010

Related U.S. Application Data

(60) Provisional application No. 60/908,154, filed on Mar. 26, 2007.

(51) Int. Cl.
*G06F 11/00* (2006.01)
(52) U.S. Cl. .......................................................... 714/54
(58) Field of Classification Search .................... 714/16, 714/42, 54
See application file for complete search history.

(56) References Cited

U.S. PATENT DOCUMENTS

| | | | |
|---|---|---|---|
| 4,251,863 A * | 2/1981 | Rothenberger | 714/54 |
| 4,380,812 A | 4/1983 | Ziegler et al. | |
| 4,479,214 A | 10/1984 | Ryan | |
| 4,535,455 A * | 8/1985 | Peterson | 714/6 |
| 4,608,687 A * | 8/1986 | Dutton | 714/710 |
| 4,654,847 A * | 3/1987 | Dutton | 714/6.1 |
| 4,931,870 A | 6/1990 | Hollander | |
| 5,212,775 A | 5/1993 | Bikowsky et al. | |
| 5,233,614 A | 8/1993 | Singh | |
| 5,267,242 A | 11/1993 | Lavallee et al. | |
| 5,291,443 A | 3/1994 | Lim | |
| 5,535,220 A | 7/1996 | Kanno et al. | |
| 5,798,670 A | 8/1998 | Lee | |
| 6,513,135 B2 * | 1/2003 | Harada | 714/42 |
| 6,667,926 B1 | 12/2003 | Chen et al. | |
| 6,845,472 B2 * | 1/2005 | Walker et al. | 714/42 |
| 7,003,704 B2 | 2/2006 | Adams et al. | |
| 7,082,453 B1 | 7/2006 | Shackleford et al. | |
| 7,185,246 B2 * | 2/2007 | Cochran et al. | 714/718 |
| 7,277,982 B2 | 10/2007 | Calvignac et al. | |
| 7,283,926 B2 | 10/2007 | Wu | |
| 7,360,035 B2 | 4/2008 | Jenkins et al. | |

(Continued)

OTHER PUBLICATIONS

"U.S. Appl. No. 12/274,044, Non Final Office Action mailed Nov. 24, 2010", 20 pgs.

(Continued)

*Primary Examiner* — Scott Baderman
*Assistant Examiner* — Joseph Kudirka
(74) *Attorney, Agent, or Firm* — Charles A. Lemaire; Lemaire Patent Law Firm, P.L.L.C.

(57) ABSTRACT

Various embodiments include fault tolerant memory apparatus, methods, and systems, including an apparatus comprising a memory device including a plurality of addressable memory locations, and a memory manager coupled to the memory device, the memory manager including a scheduling unit operable to detect a multi-bit error in data read from the memory device, and to retry the read operation in order to distinguish between an intermittent error and a persistent error.

28 Claims, 6 Drawing Sheets

U.S. PATENT DOCUMENTS

| | | |
|---|---|---|
| 7,415,640 B1 | 8/2008 | Zorian et al. |
| 7,467,337 B2 | 12/2008 | Nakamura et al. |
| 8,024,638 B2 | 9/2011 | Resnick et al. |
| 8,065,573 B2 | 11/2011 | Abts et al. |
| 2003/0037280 A1* | 2/2003 | Berg et al. .......... 714/6 |
| 2003/0088805 A1* | 5/2003 | Majni et al. ......... 714/6 |
| 2006/0047919 A1 | 3/2006 | Jenkins et al. |
| 2006/0184832 A1 | 8/2006 | Floyd et al. |
| 2007/0011396 A1 | 1/2007 | Singh et al. |
| 2009/0177932 A1 | 7/2009 | Abts et al. |
| 2009/0287889 A1 | 11/2009 | Abts et al. |

OTHER PUBLICATIONS

"U.S. Appl. No. 12/274,044, Response filed May 24, 2011 to Non Final Offiec Action mailed Nov. 24, 2011", 10 pgs.

"U.S. Appl. No. 12/274,044, Notice of Allowance mailed Jul. 6, 2011", 5 pgs.

"U.S. Appl. No. 12/484,075, Non Final Office Action mailed Oct. 7, 2011", 20 pgs.

"Micron designline", Micron Technology, Inc, vol. 12, Issue 2., Retrieved on Sep. 29, 2011 from <http://images.crucial.com/pdf/ddr2/ddr2_features_functionality.pdf>, (Jul. 31, 2003).

* cited by examiner

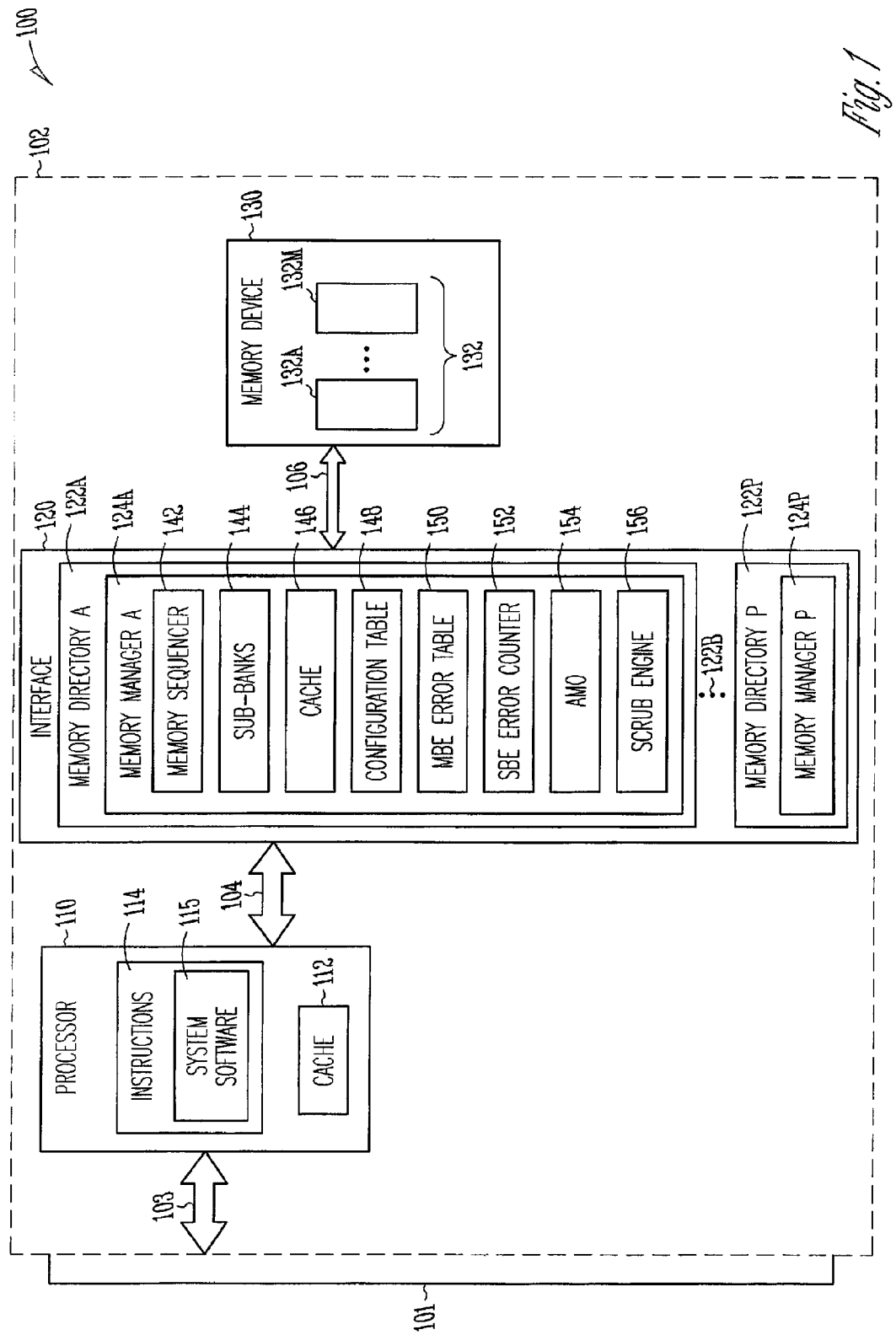

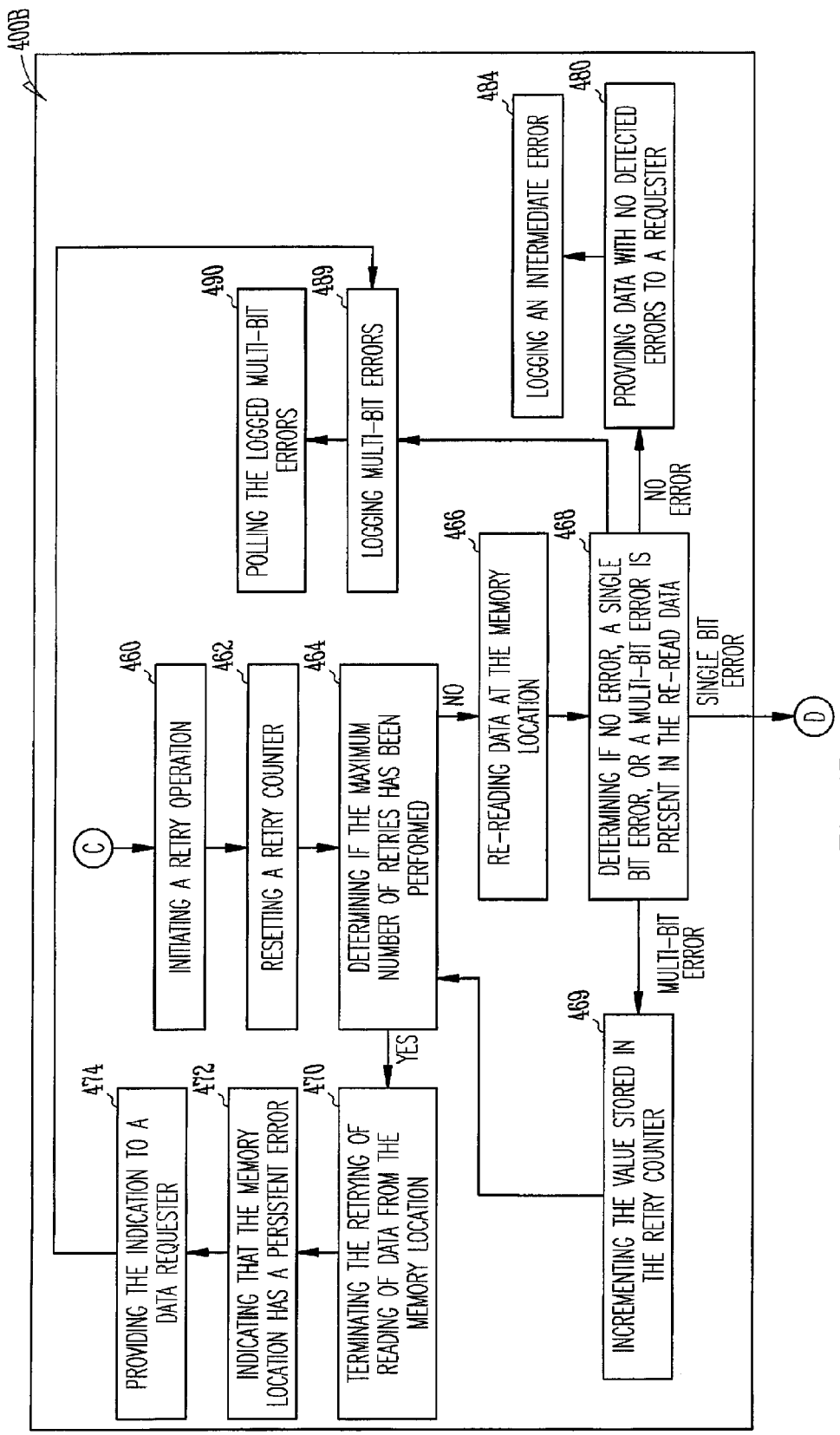

MULTI-BIT MEMORY ERROR MANAGEMENT

RELATED APPLICATION

This application claims the benefit under 35 U.S.C. 119(e) of U.S. Provisional Application Ser. No. 60/908,154 filed Mar. 26, 2007, which application is incorporated herein and made a part hereof.

FEDERALLY SPONSORED RESEARCH OR DEVELOPMENT

The U.S. Government has a paid-up license in this invention and the right in limited circumstances to require the patent owner to license others on reasonable terms as provided for by the terms of Contract No. MDA904-02-3-0052, awarded by the Maryland Procurement Office.

FIELD OF THE INVENTION

The invention relates generally to computer system memory, and more specifically to a memory manager that is operable in multiple error detection and correction modes.

BACKGROUND

A wide variety of computerized systems, from the smallest personal digital assistants to the most powerful supercomputers, use memory to store programs for fast execution, and to store data for rapid access while the computer system is operating. Volatile memory, such as the dynamic random access memory (DRAM) most commonly found in personal computers, is able to store data such that it can be read or written much more quickly than the same data could be accessed using nonvolatile storage such as a hard disk drive or flash nonvolatile memory. Volatile memory loses its content when power is cut off, so while it is generally not useful for long-term storage, it is generally used for temporary storage of data while a computer is running.

A typical random-access memory consists of an array of transistors or switches coupled to capacitors, where the transistors are used to switch a capacitor into or out of a circuit for reading or writing a value stored in the capacitive element. These storage bits are typically arranged in an array of rows and columns, and are accessed by specifying a memory address that contains or is decoded to find the row and column of the memory bit to be accessed.

The memory in a computer usually takes the form of a network of such circuit elements formed on an integrated circuit, or chip. Several integrated circuits are typically mounted to a single small printed circuit board to form a memory module, such as single inline memory modules (SIMMs) having a 32-bit memory channel for reading and writing data, or dual inline memory modules (DIMMs) having a 64-bit memory channel. Some more sophisticated types of memory modules include synchronous dynamic random access memory, or SDRAM, which runs in synchronization with the computer's bus, and double data rate (DDR) SDRAM or DDR2 SDRAM, which transfer data on both the rising and falling edges of the clock and have memory channel widths up to 64 bits of data and 8 bits of error management information per memory transfer. DDR2 SDRAM is a random access memory technology used for high speed storage of the working data of a computer or other digital electronic device.

Improvements in memory technology over time include making memory chips smaller, faster, and operable to consume less power and therefore to generate less heat. But, the constant push to improve memory performance and the imperfect nature of manufactured goods in general suggest that occasional flaws or imperfections will occur. Individual memory bit storage locations occasionally go bad, and sometimes even whole memory chips fail. It is also known that various electrical phenomena can regularly cause memory read or write errors, such as electromagnetic noise causing a signal level to change or a cosmic ray changing the state of one or more bits of memory. Reductions in the size of memory elements and reductions in the voltage used to operate the memory make such problems increasingly important to consider when designing memory.

Error management is therefore implemented in many memory systems, and is most typically embodied in a single parity bit per data byte that is operable to indicate when a single bit has changed state, or error correction codes (ECC) that can detect and often correct single-bit errors in memory systems. Even though the reliability of individual memory components is very high, the number of memory components in large computer systems and the cost involved with producing the amount of memory needed make memory error detection and correction an important consideration in memory system design.

SUMMARY

Various embodiments include an apparatus comprising a memory device including a plurality of addressable memory locations, and a memory manager coupled to the memory device, the memory manager including a scheduling unit operable to detect a multi-bit error in data read from the memory device, and to retry the read operation in order to distinguish between an intermittent error and a persistent error.

Various embodiments include a method comprising requesting data be read from a memory location, reading the data stored in the memory location, determining if an error exists in the read data, and when a multi-bit error is detected, initiating a retry operation including a re-reading of the data from the memory location up to N number of times, wherein N is an integer greater than or equal to 1 representing a maximum number of retries that may be performed during the retry operation, and determining whether the multi-bit error is an intermittent error or a persistent error.

Various embodiments include a method comprising automatically cycling through a plurality of memory locations within a memory device, detecting a multi-bit error in data read from a particular one of the plurality of memory locations, retrying the reading of the data from the particular one of the plurality of memory location up to N times, and determining whether the multi-bit error is an intermittent error or a persistent error based on whether a number of times for retrying the reading of the data from the plurality of memory location has been performed N number of times while detecting a multi-bit error in the read data for each of the retries.

Various embodiments include a system comprising a processor, an interface coupling the processor to a memory device, the interface including a plurality of memory managers, wherein each of the memory managers is associated with a different portion of the memory device, and wherein at least one of the memory managers includes a scheduling unit operable to detect a multi-bit error in data read from the memory device and to retry the read operation in order to distinguish between an intermittent error and a persistent error.

BRIEF DESCRIPTION OF THE FIGURES

FIG. 1 shows a functional block diagram of an illustrative system including a processor, an interface, and a memory device;

FIGS. 4A and 4B show a flowchart for various methods according to various embodiments described herein.

DETAILED DESCRIPTION

Figure 2A:
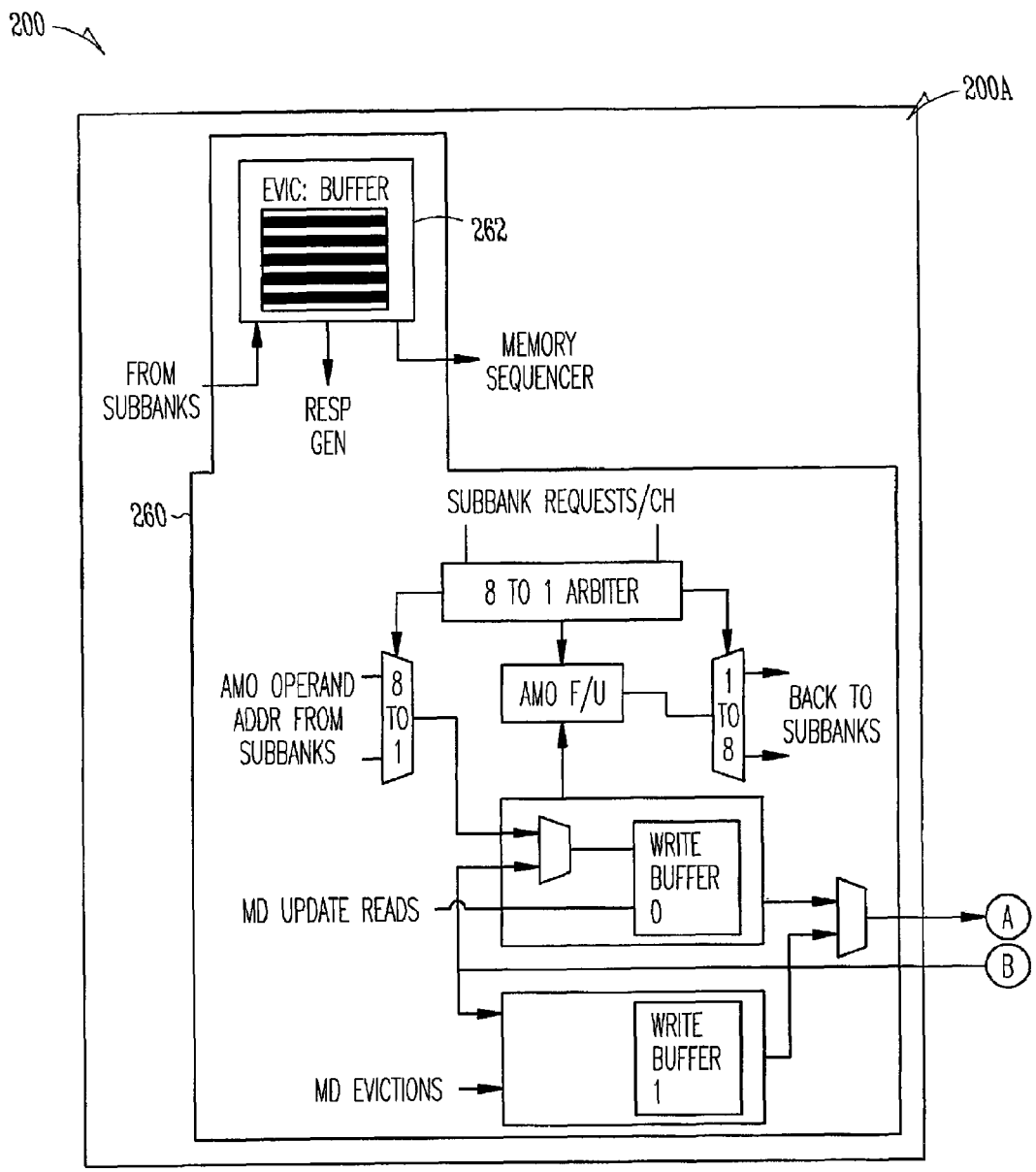
FIGS. 2A and 2B show a functional block diagram of an illustrative memory manager.

Modern DRAM devices are built from high-density, low-voltage integrated circuits that are becoming increasingly susceptible to influences from external factors such as electrical noise, process variation, and natural radiation (particle-induced upsets). The resultant errors from these effects are referred to as "soft errors" since they can corrupt the state of a storage element, but generally do not cause any permanent damage to the underlying circuitry. The rate at which these events occur is referred to as the soft error rate (SER), and has been steadily increasing as transistor geometries shrink.

A variety of error mitigation techniques are applied to reduce the impact that soft errors have on a system composed of thousands of high-density memory devices. Error correction codes (ECC), such as single error correction with double error detection (SECDED), will tolerate a single "bit flip" event, but will fail if multiple bits within the protected region (the bits over which the ECC is protecting) are flipped. The increasing density and smaller transistor cross section is expected to make multi-bit upsets more common in the future. A memory reference (read) to a location with a multi-bit error (MBE) will cause the application to fail.

Error mitigation techniques, such as ECC codes, SECDED codes, chip-kill, and other modified Hamming codes are designed to correct single-bit errors. It is possible to extend these techniques to allow multiple adjacent memory bits to be corrected, however, this approach is more expensive (requiring additional check bits) and only applies to soft errors that are clustered (effecting multiple adjacent bits within the word).

These and other problems, including the growing problem of soft errors in DRAM memory devices, are addressed by the various apparatus, methods, and systems described herein. Various embodiments include apparatus, methods, and systems including a retry mechanism providing retry operations for memory read operations. The retry operations are utilized to provide multiple attempts to read data from a memory device, and to disambiguate a MBE soft error that caused multi "bit flips" in a memory devices from a MBE soft error induced by electrical (simultaneous switching) noise, operating temperature variance, or marginal electrical signaling.

Further, it is possible for combinations of errors to simultaneously exist within data read from a given memory location, which gives the appearance of a single event with multi-bit errors. By way of illustration, a single "bit flip" event in main memory, combined with the electrical noise on the memory interface pins, can result in a soft error that contain a MBE error in read data. By retrying the faulty memory read operation, the retry hardware associated with the retry mechanism can distinguish between an intermittent error that may not appear on a read during a re-reading of the memory location providing the multi-bit error, and thus distinguish between an intermittent error and a persistent error. Persistent errors are determined to exist when a MBE error exists during an initial reading of data from a memory location, and a MBE error exists as a result of one or more retries of the read operations at the same memory location where the MBE error existed during the initial reading of the data.

In various embodiments, this solution augments other conventional techniques, such as error correction codes, to allow a retry protocol and recovery mechanism. In addition, conventional correction codes cannot disambiguate intermittent soft errors, such as those induced by electrical noise, from a persistent error, such as struck-at memory fault. The memory retry mechanism and retry operations are used to differentiate intermittent soft errors that may be caused by factors external from multi-bit soft errors in the data stored in a given memory location of a memory device. The retry mechanisms and retry operations provide a fault tolerant mechanism for avoiding errors that would otherwise cause an application failure. Furthermore, unlike approaches such as chip-kill and DRAM sparing, the embodiments employing the retry mechanisms and retry operations described herein require no additional memory storage overhead, other than the error correction code, and so are less expensive, both with respect to cost of the device and with respect to the required allocation of memory within the device.

FIG. 1 illustrates a functional block diagram of a system 100, including a processor 110, an interface 120, and memory device 130. In various embodiments, processor 110 is coupled to interface 120 through connection 104. In various embodiments, interface 120 is coupled to memory device 130 through connection 106. Connection 104 and connection 106 are not limited to any particular type of connection, and may include any type of connection or types of connections used to allow the coupling of processor 110, interface 120, and memory device 130. Connection 104 and connection 106 may include physical conductors, wireless connections, or both physical conductors and wireless connections.

In various embodiments, one or more of processor 110, interface 120, and memory device 130 are included on a circuit board 102. Circuit board 102 may include a port 101 for coupling through connection 103 the devices on circuit board 102 to one or more external devices (not shown in FIG. 1). Connection 103 is not limited to any particular type of connection and may include physical conductors, wireless connections, or both physical conductors and wireless connections.

Processor 110 is not limited to any particular type of processor. In various embodiments, processor 110 is not a single processor, and may include any number of processors operating in a multi-processor system. In various embodiments, processor 110 includes cache memory 112. In various embodiments, each of the multi-processors included in processor 110 include a cache memory 112. In various embodiments, each of a plurality of multi-processors included in processor 110 access cache memory 112, and include a separate cache memory associated with each separate processor.

In various embodiments, interface 120 includes one or more memory directory blocks 122A through 122P. In various embodiments, each memory directory block 122A through 122P includes a memory manager (MM). By way of illustration, memory directory block 122A includes memory manager 124A, and memory directory block 122P includes memory manager 124P. In various embodiments, each memory directory block included in interface 120 would include a separate memory manager, as represented by dotted line 122B. In various embodiments, each memory manager serves and is associated with a designated portion of the memory included in memory device 130.

Memory managers 124A through 124P function as an interface between the memory directory blocks 122A through 122P containing the given memory manager and the memory designated as being backed by a node associated with the given memory directory block. For instance, memory directory block 122A includes memory manager 124A, wherein memory manager 124A functions as an interface between memory directory block 122A and a designated portion of memory device 130 supported by and associated with the memory directory block 122A. In another instance, memory directory block 122P includes memory manager 124P, wherein memory manager 124P functions as an interface between memory directory block 122P and a designated portion of memory device 130 that is supported by and associated with memory directory block 122P.

In various embodiments, one or more of the memory managers 124A through 124P provide one or more of the following:
  arbitration and scheduling of the memory devices, including memory devices according to bank, row, and column dimensions to maximize the effective pin bandwidth of the memory devices;
  Fine-grained atomic memory operations (AMOs);
  Memory refresh and necessary housekeeping functionality to maintain the memory cells used to store data within the memory device;
  Automatic scrubbing of memory to repair single-bit upsets (single bit errors);
  Data poisoning and deferred error handling; and
  Spare-bit insertion to repair persistent memory errors.

In various embodiments, a given memory manager includes any combination of the following: memory sequencer 142, a plurality of subbanks 144, cache 146, configuration table 148, MBE error table 150, SBE error counter 152, atomic memory operation (AMO) unit 154, and scrub engine 156. In various embodiments, memory sequencer 142 uses subbanks 144 to store received requests to read data from the memory device associated with the memory manager 124A. Read data may be stored in cache 146. Memory sequencer 142 may initiate a retry operation in instances where read data is determined to have a MBE error.

In various embodiments, configuration table 148 is used to store configuration information used by the memory manager 124A, including in some embodiments storing a value for N representing a maximum number of retry operations the memory sequencer 142 is to perform during a given retry operation. In various embodiments, MBE error table 150 is used to log the detection of MBE errors in read data, including intermediate errors and persistent errors. In various embodiments, SBE error counter 152 is used to log the number of occurrences including single bit errors occurring on a particular column of data for one or more portions of the memory device 130 associated with the memory manager 124A.

In various embodiments, AMO unit 154 is used to perform atomic memory operations on one or more memory locations in the portion of memory device 130 associated with memory manager 124A. In various embodiments, AMO unit 154 performs a read-modify-write operation on one or more memory locations in the portion of memory device 130 associated with memory manager 124A.

In various embodiments, scrub engine 156 is used to perform a memory scrubbing operation on some portion of memory device 130 associated with the corresponding memory manager 124A. In various embodiments, scrub engine 156 scrubs a portion of the memory device 130 in order to detect and correct single bit errors in the scrubbed portion of the memory device 130. In various embodiments, scrub engine 156 performs a spare-bit insertion function to perform a read-modify-write sequence to insert a new spare-bit into each read data from a memory location included in the memory device 130 and associated with the memory manager 124A.

A more detailed description of memory managers and the functions provided by the memory managers, for example but not limited to memory managers 124A through 124P, is provided in conjunction with FIG. 2 and the written description included herein.

Returning to FIG. 1, memory device 130 is not limited to any particular type of memory device. In various embodiments, memory device 130 includes a plurality of memory chips 132 represented by memory chips 132A-M. In various embodiments, memory device 130 includes DRAM memory. In various embodiments, memory chips 132A-M include DRAM memory. In various embodiments, one or more of memory chips 132A-M are double-data-rate two synchronous dynamic random access memory (DDR2 SDRAM) devices.

Memory device 130 is not limited to any particular configuration. In various embodiments, memory chips 132A-M are organized as five 8-bit devices, for a total of 40 bits. In some embodiments, only 39 of the 40 bits are used, where 32 bits are used for data and 7 bits are used to store an error correction code associated with the data bits. In various embodiments, the remaining bit is used to dynamically map out bad bits within the device, including the spare bit in a spare-bit insertion to repair persistent memory errors within the memory location providing the spare bit and having a persistent bit error.

In operation, interface 120 in system 100 may receive a request to read data from one or more memory locations in memory device 130. The request to read data may come from processor 110. In various embodiments, multiple requests to read data are being handled at interface 120 at any given time. In various embodiments, requests from both processor 110 and scrub engine 140 are capable of being or are being processed at interface 120 at any given time. The term "requester" is used throughout the specification to refer to any application or device that requests data to be read from one or more memory locations in a memory device capable of storing data.

For a given request to read data from a particular memory location, the memory location including data and the associated error code is read from the memory device 130 and provided to the particular memory manager 124A-124P managing the request.

After reading the data, the particular memory manager 124A-124P managing the request will use the error correction code included in the read data to determine if the read data has a bit error, including whether the data includes a single bit error or a multi-bit error. In various embodiments, if a single bit error is detected, the single bit error is corrected, and the corrected data is forwarded to the processor in instances where the processor 110 requested the data. In various embodiments, the corrected data is forwarded to the requester having made the request for the read data. In various embodiments including scrub engine 156, where the scrub engine requests the data from memory device 130 and a single bit error is detected, the scrub engine 156 is operable to correct the data using the error correction code, and to write the corrected data back to memory device 130.

In various embodiments, when interface 120 receives a request to provide data from memory device 130, and the read data from a particular memory location is determined to have a multi-bit error, a retry operational is initiated. In various embodiments, the retry operation is only initiated when the read data having the multi-bit error is indicated as being as non-poisoned data. Poisoning of data in a memory location may be used as an indication that a particular memory location in a memory device includes a persistent multi-bit error. Poisoning may be indicated by a particular value or a particular bit pattern associated with poisoning within a particular memory location where the data in the memory location has been determined to include a persistent multi-bit error.

In instances where a multi-bit error on non-poisoned data has been detected by interface 120, the particular memory manager 124A-124P handling the request is operable to initiate a retry operation. In various embodiments, a retry operation includes reading the data again from the same memory location. The second read operation results in a second data set. The second data set may then be evaluated to see if the second data set still includes a multi-bit error, and may include determining if the error is the same multi-bit error as was detected in the initially read data set. If no error is detected in the second data set, or only a single bit error is detected in the second data set, a soft error has been detected in the first set of read data. When no error is detected in the second data set, the data from the second data set is passed along to the requester of the data. If a single bit error is detected in the second data set, the single bit error is corrected using the error correction code associated with the read data, and the corrected data is passed along to the requester.

In various embodiments, in instances where the second data set also includes a multi-bit error, a third read of the data from the memory location may be performed. Again, the third data set is checked to see of no error, or if only a single bit error, is detected in the third set of read data. Again, if no error is detected, the data as read in the third read operation may be passed along to the requester. If a single bit error is detected, the single bit error may be corrected and passed along to the requester.

In various embodiments, a retry operation that results in no errors being detected in the re-read data will result no additional reads being performed on the particular memory location based on the original request for data from that memory location. In various embodiments, a retry operation that results in a single bit error in the re-read data will result in no additional read operations being performed on the particular memory location based on the original request for data from that memory location. In various embodiments, a retry operation that results in a multi-bit error being detected in the re-read data will result in another retry. In various embodiments, the number of retry operations that will be performed is a integer N greater than or equal to zero and less than or equal to a positive integer greater than or equal to one. In various embodiments, N is any integer greater than or equal to one. By way of illustration, where N=1, then a single retry operation will be performed if a multi-bit error is detected in data read. In another instance, where N=10, up to ten retry operations may be performed when the original reading of the data and each of the subsequent 9 retry operations result in a multi-bit error being detected in the re-read data.

In various embodiments, a setting of N=0 represents a disabling of the retry operation when a multi-bit error is detected in read data. In various embodiments, when N=0, no retry operations including a re-reading of the requested data having a multi-bit error on an original read of the data will be performed. However, in some embodiment where N=0, other operations associated with the detection of a single bit or a multi-bit error may be performed, including but not limited to logging of the detection of a data error following an original reading of data from a memory location.

In various embodiments, following any one of the re-reading operations of the data performed as part of a retry operation, if no errors are detected, the re-read and error free data is passed along to the requester, and no additional re-reads of that memory location are performed, even when the number of retry operations already performed is less than the maximum number of retries designed by the value N. In various embodiments, N is a configurable value that may be configured by a user of system 100. In various embodiments, a value for N may be stored in configuration table 148 within each memory manager. In various embodiments, each of memory managers 124A-124P include a separate configuration table 148, wherein a value for N may be stored for each individual memory manager, and wherein each value of N is independent and may be different from any other value for N as stored in any other configuration table.

In various embodiments, when the number of retry operations performed for a given memory location for a given request is equal to the value of N, and no re-read data has returned a set of data that did not include a multi-bit error, the retry operation is terminated and the memory location having being read N times and having provided a multi-bit error each time is considered to have a persistent error. In various embodiments, the data from the read memory location having the persistent error is not passed along to the requester. In various embodiments, an indication, such as a memory address, for the memory location having the persistent error is stored in a MBE error table, such as MBE error table 150 in memory manager 124A.

In various embodiments, instructions 114 include system software, such as but not limited to system software 115. In various embodiments, system software 115 may interrogate the MBE error tables, such as MBE error table 150, to diagnose memory fault patterns, including those with repeated MBE errors as detected during a retry operation. In various embodiments, a persistent error related to a particular memory location is raised to the operating system so that an application observing the error can be terminated, and the memory page that includes the faulty memory location can be removed from a free-page list. A free page list is a listing of pages of memory that are available for memory operations, including read operations and write operations, used by an application. In various embodiments, one or more of the operating system and the free page lists may be included in system software 115.

Figure 2B:
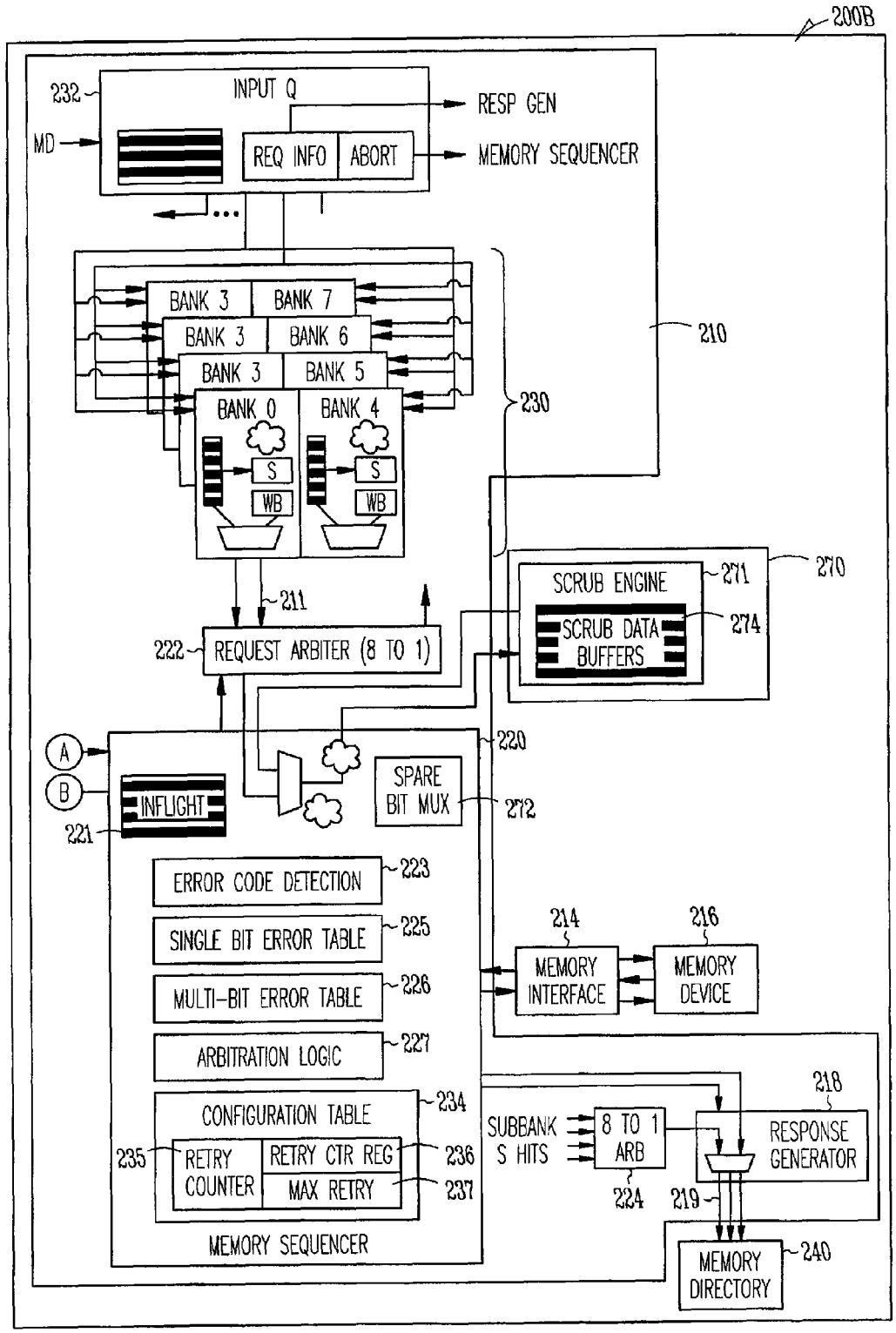

FIGS. 2A and 2B illustrate a functional block diagram of an illustrative memory manager 200, including portions 200A and 200B. Memory manager 200 is not limited to any particular type of memory manager. In various embodiments, memory manager 200 is any one of the memory managers 124A-124P as shown in FIG. 1. In various embodiments, memory manager 200 is coupled to memory directory 240, as shown in FIG. 2B.

In various embodiments, memory manager 200 includes any combination of the following: AMO unit 260, scheduling unit 210, and scrub unit 270. In various embodiments, AMO unit 260 is coupled to scheduling unit 210 and memory directory 240. In various embodiments, scrub unit 270 is coupled to scheduling unit 210.

In various embodiments, scheduling unit 210 is coupled to and associated with a portion of memory device 216, wherein other memory managers (not shown in FIGS. 2A and 2B) are associated with various different potions of memory device 216. Memory device 216 is not limited to any particular type of memory device, and in some embodiments is memory device 130 as described in conjunction with FIG. 1.

Again referring to FIGS. 2A and 2B, in various embodiments, scheduling unit 210 includes memory sequencer 220 coupled to subbanks 230 through request arbitrator 222. In various embodiments, memory sequencer 220 is coupled to memory directory 240 through response generator 218. In various embodiments, memory sequencer 220 is coupled to memory device 216 through interface 214. In various embodiments, subbanks 230 are coupled to response generator 218 through arbitrator 224.

In various embodiments, memory sequencer 220 includes any combination of the following: error code detection block 223, single bit error (SBE) table 225, multi-bit error (MBE) table 226, arbitration logic 227, and a configuration table 234. In various embodiments, error code detection block 223 is operable to determine if an error exists in read data, both single bit errors and multi-bit errors, based on the error correction code associated with the read data. In various embodiments, SBE table 225 includes a plurality of counter registers operable to store a count value for the number of detected single bit errors associated with a particular column of read data. In various embodiments, MBE table 226 is operable to store addresses associated with memory locations that provided multi-bit errors, both intermediate errors and persistent errors, when data was read for the memory locations.

In various embodiments, configuration table 234 is operable to store configuration settings associated with memory manager 200. In various embodiments, configuration table 234 includes a retry counter 235 including a retry counter register 236 and a maximum retry register 237. In various embodiments, retry counter register 236 is operable to store a value for the number of retry read operations that have been performed during a given retry operation associated with a given memory location. In various embodiments, maximum retry register 237 includes a value for a maximum number of retry read operations that are to be performed during a given retry operation associated with a given read request.

In various embodiments, memory subbanks 230 may include a plurality of memory banks 0-7, and an input queue 232. In various embodiments, input queue 232 is coupled to memory directory 240, to response generator 218, and to memory sequencer 220. In various embodiments, input queue 232 is operable to receive from memory directory 240 requests for data to be read from one or more memory locations in memory device 216. In various embodiments, subbanks 230 are operable to store these requests, along with a memory manager transaction identifier (MMTID) provided by memory sequencer 220 that uniquely identifies the stored request.

In various embodiments, scrub unit 270 includes scrub engine 271 coupled to memory sequencer 220 and spare bit mux 272. In various embodiments, scrub engine 271 is operable to provide memory scrubbing operations to a portion of memory device 216 that is associated with memory manager 200. In various embodiments, a scrub data buffer 274 included in scrub engine 271 is operable to provide a list of data and spare bit insertion information to be used by spare bit mux 272 to perform a spare-bit insertion on the data provided to response generator 218 and output to memory directory 240.

In operation, requests to read data are provided by memory directory 240 to scheduling unit 210. In various embodiments, the requests to read data are provided by the memory directory 240 through input queue 232, and are stored in one of the subbanks 230.

In various embodiments, memory sequencer 220 keeps track of each request individually. In various embodiments, memory sequencer 220 is operable to assign a memory manager transaction identifier (MMTID) to a request, the MMTID to uniquely identify the request from any other requests being processed by memory sequencer 220. In various embodiments, the MMTID for each request is stored in inflight table 221. Memory sequencer 220 organizes and controls the order of the requests to read data from a portion of memory device 216, including the actual receiving of the requested data between the memory sequencer 220 and the memory device 216, using arbitration logic 227. When a particular request is being operated on, a request for the data associated with the particular request is made through request interface 214, and the associated data is read from the memory location within memory device 216. The read data is returned to memory sequencer 220. In various embodiments, the returned data includes data bits and an error correction code associated with the data bits.

In various embodiments, memory sequencer 220 includes an error code detection block 223 operable to extract the data bits and the error correction code associated with the data bits as received in the read data, and determine if an error exists in the data bits based on the error correction code. In instances where no errors are detected, memory sequencer 220 passes the data to response generator 218, which further passes the data to memory directory 240. In instances where an error is detected, the error code detection block 223 is operable to determine if the error is a single bit error or a multi-bit error. If the error is a single bit error, the error correction code can be used to fix the single bit error, and to output the corrected data to the requester. In various embodiments, the single bit error is logged in a SBE table 225. In various embodiments, logging a single bit error includes storing in the single bit error table 225 an indication as to the bit position within the data bits where the single bit error occurred. In various embodiments, the bit position is associated with a particular column line used in reading the bits included in a plurality of memory locations and associated with a same particular bit position within each of the plurality of memory locations.

In instances where memory sequencer 220 determines that a multi-bit error has occurred in the read data, memory sequencer 220 can initiate a retry operation. In various embodiments, initiation of a retry operation includes marking the request with a squash bit to indicate that the request will be retried. In various embodiments, a squash bit includes changing the status of one or more bits included in the MMTID associated with the request for which the retry operation is being performed. The marking of a request with a squash bit prevents the memory directory 240 from getting multiple read replies from a single request that is being retried due to a multiple-bit error.

In various embodiments, memory sequencer 220 can arbitrate the requests going to the memory device 216 using arbitration logic 227 so that the requests associated with the retry operation take precedence over any other requests for data directed to the memory device 216. In various embodiments, upon initiation of a retry operation, memory sequencer 220 will immediately (subject to the bank cycle time of the device) schedule the retry operation. Arbitration logic 227 within memory sequencer 220 gives the retry request priority so that no other requests are allowed to be reordered in front of the retry operation. In other words, the next reference to the memory device 216 where the multi-bit error occurred is guaranteed to be the retry request.

In various embodiments, memory sequencer 220 includes a retry counter 235. Retry counter 235 is operable to count the number of retry operations performed for any given retry operation. In various embodiments, retry counter 235 includes a retry counter register operable to store a value indicating the number of retry operations that have been performed during a given retry operation and for a given request. In various embodiments, retry counter 235 includes a maximum retry register 237. Maximum retry register 237 is operable to store a value indicating the maximum number of times a retry operation is to be performed for any given request. In various embodiments, a re-reading of the data from a memory location having a multi-bit error results in the value for the retry counter register 236 being incremented by one. Before any additional re-reading operation for a given request and associated with the retry operation are performed, the value stored in the retry counter register 236 is compared to the value stored in the maximum retry register 237. If the value in the retry counter register 236 is equal to (or for some reason greater than) the value stored in the maximum retry register 237, no additional re-tries to re-read the data in the given memory location will be performed during the given retry operation associated with the given request. If all the readings for the data from the given memory location result in multi-bit error being detected, the given memory location will be deemed to have a persistent error. In various embodiments, if a persistent error is detected, the persistent error is logged in MBE table 226. In various embodiments, logging a persistent error includes storing an address associated with the memory location in memory device 216 that generated the persistent error as a result of a retry operation.

In various embodiments, scrub engine 271 as included in scrub unit 270 performs a memory scrubbing operation, including the scrubbing of memory locations included in memory device 216, to detect and correct bit errors. Assuming that soft errors follow a uniform distribution in a memory device, the longer a word of used data lives in the memory device 216, the more likely it will be to suffer the effects of any number of soft errors. In the worst case, a sufficient number of bits will be upset to result in silent data corruption. In an effort to prevent independent single-bit errors from compounding to form multi-bit errors and result in an application error, the memory manager 200 implements a hardware-based memory scrub engine 271. The scrub engine 271 is capable of cycling through one or more portions of memory device 216, and reading and correcting any encountered single-bit errors by writing back corrected data. The scrub engine 271 could have been implemented to write back non-poisoned double-bit errors as poisoned errors. However, this would result in a loss of the capability of detecting faulty stuck-at memory bits that can be found when a particular word consistently suffers from single-bit errors even after being scrubbed repeatedly.

In order to make the scrub engine 271 as non-intrusive as possible, it is desirable to perform scrub reads when the connection between the one or more portions of memory device 216 is otherwise idle. At the same time, certain quality of service (QoS) guarantees must be made, ensuring that the entire memory device 216 is scrubbed with a specified refresh frequency. To satisfy these requirements, scrub engine 271 uses a scheme in which a memory device scrub cycle is broken up into fixed periods, each of which will include a single scrub read request.

In addition, each scrub period is divided into two distinct time regions, the first of which will perform an early scrub read if no other traffic is present at the eight-to-one request arbiter. However, at some point the scrub request must be considered a priority, and in the second phase of each period, user requests will be blocked out allowing the memory device 216 to idle and make way for the pending scrub request.

As an alternative to the memory device auto-refresh capability, the scrub unit 270 may, in some embodiments, implement a distributed refresh algorithm that avoids the bank quiescence necessary with auto-refresh, and consume less pin bandwidth than auto refresh. However, with higher-density parts (with more rows that need to be refreshed in a distributed manner) the benefit is more modest. Distributed refresh works by interleaving reads requests, whose purpose is to merely touch and refresh memory, into the normal request stream. When distributed refresh is enabled, scrubbing is piggy-backed on top of it, allowing all of the scrub reads to be performed at no cost. With memory scrubbing, the memory manager 200 is able to cope with uniformly distributed memory device soft errors without sacrificing memory bandwidth.

In various embodiments, the memory device 216 provides 40-bits of data where only 39-bits are needed. The additional data bit can be multiplexed into the data path using a series of 2-to-1 multiplexers, such as spare bit mux 272. The control of each max is selected individually according to the bit position that is to be skipped so that the "spare" bit is used instead. This spare-bit insertion can be done with relatively little interaction with the normal request path. The spare-bit logic is an adjunct to the refresh/scrubbing logic described earlier. If a spare-bit insertion sequence is run, the scrub logic is set to always execute a 32-byte read-modify-write sequence to insert the new spare-bit selection. If the memory manager 200 is set to use auto-refresh instead of the distributed refresh/scrub sequence, the same scrubbing and spare-bit functions execute with the likely difference that the specified inter request wait interval will be set to a longer/higher value. However, it may be desirable to change the spare-bit location in a more timely fashion in an effort to avoid potentially compounding errors.

In such a case, the inter-request counter may be set to a shorter (smaller) value before the spare-bit insertion pass is started so that it does not require excessive time. Since, obviously, this spare-bit cannot be inserted instantaneously, there must be a mechanism to track which memory words use the newly inserted spare-bit location and which use the previous location. To accomplish this while incurring a minimal cost, a single pointer is used to mark the ending boundary between words that use the new and words that use the old spare-bit locations. The insertion sequence is only started once the distributed refresh and scrub engine has rolled over, guaranteeing the starting bound to always be at address zero. In order to determine which bit position makes for a good spare-bit candidate, a set of single-bit error histograms are provided—with a bin for each of the forty (40 bit positions. These histograms track the location of all single bit errors and can be periodically polled by system software. Although soft errors in a memory system should be uniformly distributed within the memory space, the memory space is not necessarily uniformly accessed. Memory references will likely possess some locality. Therefore, commonly observed single-bit errors will be exposed by reading the histogram registers and examining the frequency of errors. Using the histogram data provides an informed decision about which failing bit to replace with spare-bit insertion. Through the use of spare-bit insertion, the memory manager 200 can overcome what appear as column clustered soft errors that may, for example, be the result of noisy memory channel.

Figure 3A:
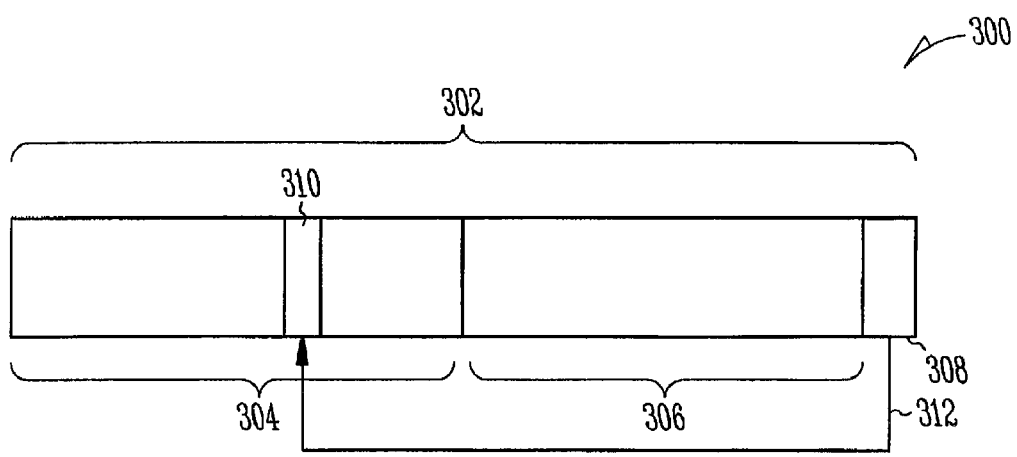
FIG. 3A shows an illustrative memory location for storing data.

FIG. 3A shows an illustrative memory location 300 for storing data. Memory location 300 may be any addressable memory location in a memory device, such as but not limited to memory device 130 as shown in FIG. 1, or memory device 216 in FIG. 2B. As shown in FIG. 3A, memory location 300 includes a plurality of bits 302. In various embodiments, the plurality of bits 302 includes a plurality of data bits 304. In various embodiments, the plurality of bits 302 includes a plurality of error correction code (ECC) bits 306. In various embodiments the plurality of bits 302 includes at least one spare bit 308. In various embodiments, ECC bits 306 may be used to store an error correction code associated with the data stored in the plurality of data bits 304. The data stored as the ECC bits 306 may be read in conjunction with the reading of the plurality of data bits 304 on read operations of memory location 300, and used to determine if a single bit error or if a multi-bit error has occurred in the read data. In addition, the data stored as ECC bits 306 may be used to determine if a soft error has occurred during the initial reading of data from memory location 300 by using the data stored as ECC bits 306 to determent if an single bit error or a multi-bit error exists in the data read from memory location 300 during one or more retry operations involving re-reading of the data from memory location 300.

In various embodiments, the at least one spare bit 308 may be used as a data value in a spare-bit insertion associated with the data stored in memory location 300 and in place of one of the data bits 304. In various embodiments, where a persistent single bit error is determined to exist for a particular memory location, or for a particular group of memory locations, the memory location or the group of memory locations may use the at least one spare bit 308 as a replacement bit in the plurality of data bits 304 in order to provide a properly functioning data bit in place of the data bit determined as causing a persistent single bit error.

By way of illustration, bit 310 within the plurality of data bits 304 may be determined to have a persistent single bit data error associated with memory location 300. This determination may have been made during a retry operation that was performed on memory location 300 that resulted in a single bit error being detected for one or more of the N number of retry operations performed on memory location 300 and all related to data bit 310. Based on this determination, a bit included in the at least one spare bit 308 may be designated as the new location for storing the data associated with data within the plurality of data bits 304 and in place of using data bit 310. In such instances, memory location 300 may continue to be used despite a single bit data error, such as data bit 310 having a persistent single bit error, by the substituting data bit 308 for data bit 310 at memory location 300. It would be understood that the use of the at least one spare data bit could be expanded for any of the memory locations included in a memory device, and that memory location 300 is merely illustrate. In various embodiments, multiple bits included in the at least one spare data bits 308 may be used as spare bits for multiple data bits within the plurality of data bits 304, wherein multiple bits from the at least one spare bits 308 are individually mapped to replace individual data bits within the plurality of data bits 304.

In various embodiments, memory locations such as memory location 300, where the use of at least one spare bit has been activated, are tracked using a table, such as but not limited to the SBE error counter 152 as shown in FIG. 1, or the SBE table 225 as shown in FIG. 2B. In various embodiments, the table used to track the activation of the at least one spare bit includes bins for each of the data bit positions included in the plurality of bits 302 for a given memory location, such as memory location 300. In various embodiments, these bins are used to generate histograms that track the location of a plurality, or in some instances all of single bit errors in a memory device. In various embodiments, these histograms can be polled by system software, such as system software 115 as shown in FIG. 1. In various embodiments, patterns related to portions of a memory device that include single bit memory errors may be determined. This information may be used in decisions as to which failing bit to replace with a spare bit insertion. Through the use of spare-bit insertion, a system such as but not limited to system 100 in FIG. 1 can overcome what appears as a column-clustered software errors that are the result of a noisy memory channel resulting in single bit errors occurring in a plurality of adjacent memory locations being read from a common memory channel.

Figure 3B:
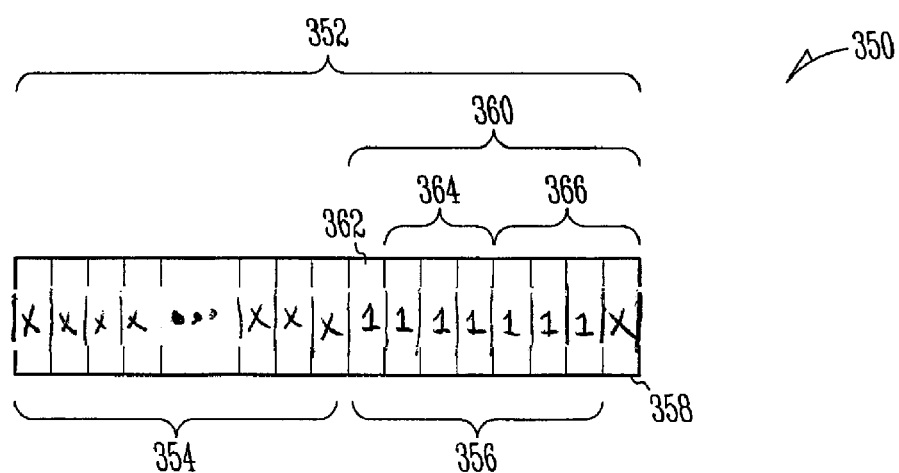
FIG. 3B shows and illustrative memory location for storing data.

FIG. 3B shows and illustrative memory location 350. Memory location 350 is not limited to any particular memory location, and is illustrative of any memory location that may be included in a memory device, such as but not limited to memory device 130 as shown in FIG. 1, or memory device 216 as shown in FIG. 2B. In various embodiments, memory location 350 is a memory location the same as illustrated by memory location 300 in FIG. 3A. Returning to FIG. 3B., memory location 350 includes a plurality of bit 352. The plurality of bits 352 includes a plurality of data bits 354, a plurality of error correction bits 356, and at least one spare bit 358. In various embodiments, a value of "7F" hexadecimal is written to the plurality of error correction bits 356 to indicate that the memory location is poisoned. A hexadecimal value of "7F" represents a bit value of "1" for all bits included in the error correction bits 356. In various embodiments, data bits 354 and spare bit 358 include an "X" wherein "X" is a "don't care" value for the value, if any, stored in spare bit 358. The data written to a memory location to indicate that the memory location is poisoned is not limited any particular data, and the "7F" code in FIG. 3B is merely illustrative.

Figure 4A:
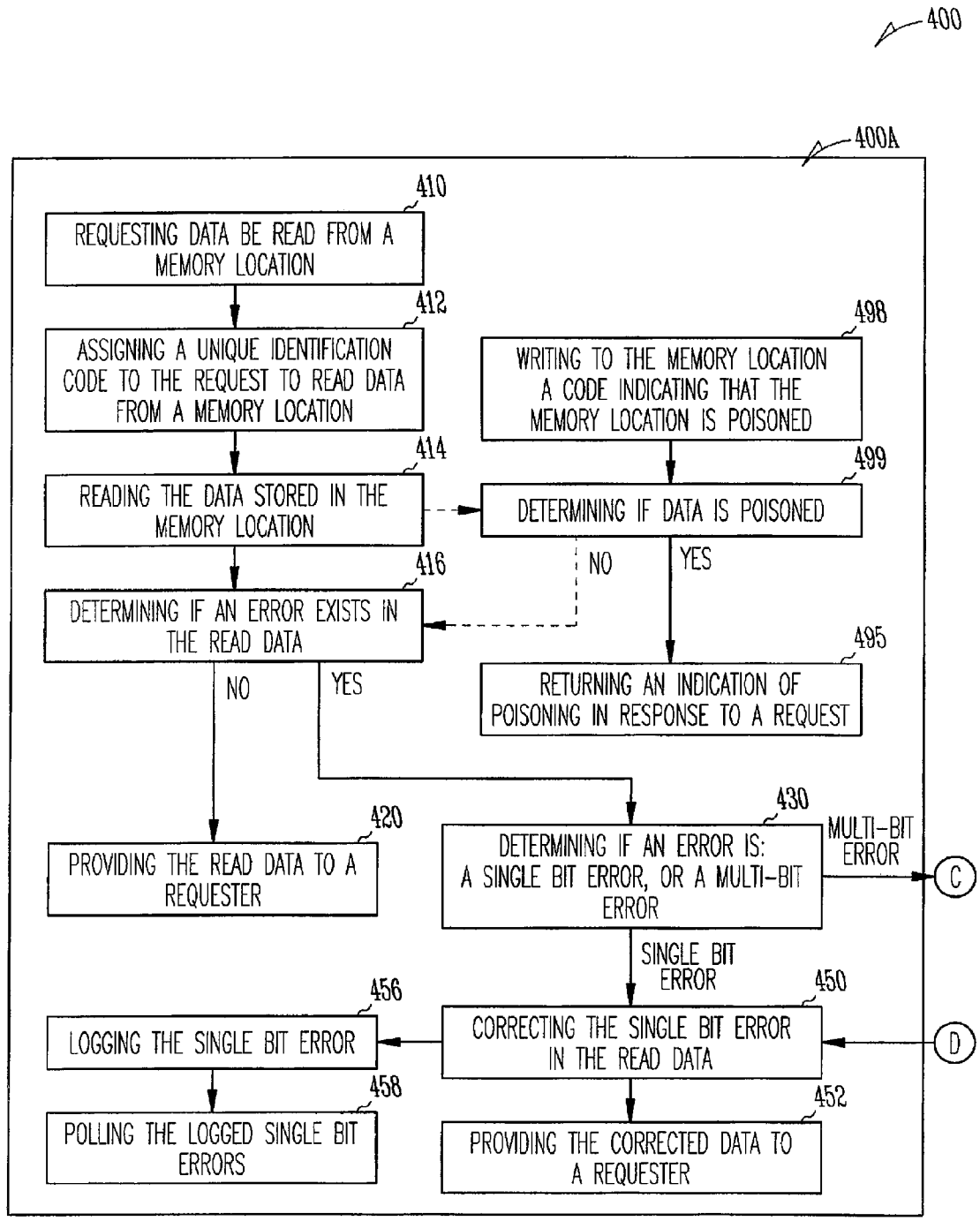

FIGS. 4A and 4B is a flowchart for a method 400, including portions 400A and 400B, according to various embodiments.

In various embodiments, method 400 at block 410 includes requesting data be read from a memory location. In various embodiments the request to read data may be requested as part of running a software application. In various embodiments, the request to read data may be made as part of a memory scrubbing operation. In various embodiments, the request to read data may be made as part of an atomic memory operation.

In various embodiments, method 400 at block 412 includes assigning a unique identification code to the request to read data from a memory location. In various embodiments, the unique identification code uniquely identifies the request to read data from any other currently active request to read data.

In various embodiments, method 400 at block 414 includes reading the data stored in the memory location. In various embodiments, reading the data includes reading data bits and reading an error correction code associated with the data bits stored in the memory location.

In various embodiments, method 400 at block 416 includes determining if an error exists in the read data. In various embodiments, the determination is made based on the associated error correction code. In instances where no error is detected in the received data, method 400 progresses to block 420, which includes providing the read data to a requester. A requester may include any software or any device that has requested a reading of the data stored at the memory location.

In various embodiment, in instances where an error is determined to exist in the read data, including an error detected based on the error correction code, method 400 progresses to block 430 including determining if the error is a single bit error or a multiple bit error.

In various embodiments, in instances where only a single bit error is determine to exist in the read data from the memory location, method 400 progresses to block 450, including correcting the single bit error using the error correction code associated with the read data. In various embodiment, after correcting the single bit error, method 400 progresses to block 452, including providing the corrected data to a data requester. In various embodiments, method 400 includes at block 456 logging into a single bit error table information associated with the detection of a single bit error at the memory location. In various embodiments, the logging of the single bit error includes incrementing a counter value associated with a column or a bit line where the single bit error occurred. In various embodiments, the logging of the single bit error includes adding the data concerning the single bit error to a histogram representative of the frequency at which single bit errors have occurred and sorted by column or bit lines. In various embodiments, method 400 includes at block 458 polling the logged single bit errors. Polling the logged single bit errors may include forming a histogram of the logged single bit errors, the histogram representative of the frequency distribution of single bit errors associated with each of a plurality of column or bit lines.

In various embodiments, in instances where a multiple bit error is detected at block 430, method 400 proceeds to block 460 including initiating a retry operation. In various embodiments, initiating a retry operation includes setting a squash bit associated with the unique identification code for the reading of data that resulted in returning data having a detected multi-bit error. In various embodiments, initiating a retry operation includes setting a value in a retry counter to zero. In various embodiments, initiating a retry operation includes inhibiting all requests directed to the portion of a memory device associated with the memory location on which the retry operation is being performed, other than the requests for re-reading the data from the memory location providing the multi-bit error when the memory location was last read.

In various embodiments, method 400 includes at block 462 resetting a retry counter. In various embodiments, method 400 includes at block 464 determining if the maximum number of retries has been performed for this given retry operation. In various embodiments, determining if the value of the retry counter is equal to the value in the maximum number of retries includes comparing a the value in the retry counter to the maximum value to determine if the value in the retry counter is equal to a value configured to be the maximum number of retries In various embodiments, if the value of the retry counter is greater than the value of the maximum number of retries, the value of the retry counter is considered to be equal to the value of the maximum number of retries.

At block 464, if a determination is made that the maximum number of retries has not been performed, method 400 proceeds to block 466. Block 466 includes re-reading the data from the memory location having the multiple bit error detected during the last reading of the memory location, and at block 468 determining if no error, a single bit error, or a multi-bit error is present in the re-read data.

In various embodiments, in instances where the re-read data does not include an error, method 400 proceeds to block 480, including providing the re-read data to the requester. In various embodiment, method 400 at block 484 includes logging an intermediate error associated with the memory location on which the re-read was performed and on which the multi-bit error detected in the originally data reading was not detected during at least one of the subsequent re-readings of the data from the same memory location.

Returning to block 468, in instances where a single bit but not a multi-bit error is detected, method 400 proceeds to block 450, including correcting the single bit error in the data. From block 450, method 400 may include any of blocks 452, 456, and 458 as described above.

Again retuning to block 468, in instances where a multi-bit error is detected in the re-read data, method 400 proceeds to block 469, including incrementing the value stored in the retry counter. Method 400 proceeds to block 464. At block 464, a determination is again made as to whether the maximum number of retries has been performed. If a determination is made that the maximum number of retries has not been performed, method 400 proceeds to block 466, and proceeds as previously described.

If at block 464 a determination is made that the maximum number of retries has been performed, method 400 proceeds to block 470, including terminating the retrying of reading of data from the memory location. Method 400 proceeds from block 470 to block 472, wherein block 472 includes indicating that the memory location has a persistent error. Indicating that a memory location has a persistent error may include logging the memory location as having a persistent error in a error register, for example but not limited to a multiple bit error register. In various embodiments, method 400 includes at block 474 providing the indication of a memory location having a persistent error to a requester.

The cycle of re-reading the memory location may be repeated a number of times as long as the re-read data continues to include a multi-bit error as a result of each re-read, and as long as the number of re-reads based on the values in the retry counter does not equal (or exceed) the value of the maximum number of retries. At block 464, in instances where a determination is made that the value of the retry counter is equal to (or greater than) the value of the maximum number of retries, method 400 proceeds to block 470 including termination of the retry operation. In various embodiments, method 400 proceeds to block 474 including outputting an error indication to a data requester. In various embodiments, method 400 includes block 489 including logging a failed retry operation associated with a memory location. In various embodiments, logging a failed retry operation includes logging the failed retry operation in a multi-bit error register. In various embodiments, logging the failed retry operation in the multi-bit error register includes storing an address associated with the memory location associated with the failed retry operation.

In various embodiments, method 400 includes block 498, including writing one or more bits to a memory location to indicate that the memory location is poisoned. In various embodiments, method 400 proceeds from block 414—reading the data stored in a memory location—to include block 499, determining if data at a memory location is poisoned. In instances were where the memory location not poisoned, method can return to block 416. In instances where the memory location is poisoned, method 400 can proceed to block 495 including returning an indication that the memory location is poisoned to a requester.

In various embodiments, a special ECC value, in some instances having a syndrome of all ones, is used to indicate a data word that is poisoned. Poisoned refers to data contained in memory location that is corrupted. Poisoning may occur when a hardware error in the cache that corrupts the cache data is written back to the memory device. In such instances, the special ECC value is used to indicate the particular memory location is poisoned, and thus to avoid use of the corrupted data.

As described herein, the memory manager functions as an interface between the memory directory (MD) hardware structure and the memory devices. The principal role of the memory manager is to schedule the memory devices (according to bank, row, and column dimensions) to maximize memory bandwidth. In addition, it provides the necessary housekeeping functionality to maintain the memory cells (refresh, memory configuration, timing for different memory parts, etc).

When a read response returns from the memory device interface the error correction code is checked for integrity. If a single-bit error is detected, the corrected data is forwarded along with the remainder of the read data (the bits in main memory are not immediately corrected). In various embodiments, an atomic memory operation (AMO) that returns an MBE on the read portion of the read-modify write cycle will write the data back as poisoned. In various embodiments, all memory references that return an error response that is non-poisoned are retried. In various embodiments, the memory sequencer maintains a list of requests that are currently in-flight for each memory device memory bank. If an error is detected in the read data, the error is logged in the MBE error table. System software can interrogate this structure to inspect error signatures and diagnose faulty memory parts (those with repeated MBEs).

In various embodiments, when an MBE is detected, the memory sequencer will immediately (subject to the bank cycle time of the device) schedule the retry operation. Arbitration logic in the memory sequencer gives the retry request priority so no other request are allowed to be reordered in front of the retry operation—the next reference to the bank where the MBE occurred is guaranteed to be the retry. This retry operation is repeated N times (where N is set by a configuration register in the memory manager) or until the checksum on the read data is valid (no error). After N failed attempts to read the faulty memory location, the memory sequencer returns an error response and the error is logged as a persistent MBE in the error table.

The memory sequencer keeps track of a memory manager transaction identifier (MMTID) that is used to uniquely identify each request. When an MBE occurs, the memory reply is marked with a squash bit to indicate that this request will be retried. This prevents the memory directory from getting multiple read replies for a single request that was retried because of an MBE.

Memory retry mechanism is operable to differentiate intermittent soft errors caused by external factors from a multi-bit soft errors in the storage cells of a memory device. The retry mechanism further provides a fault-tolerant mechanism for avoiding errors that would otherwise cause an application failure. Furthermore, unlike other approaches such as chip-kill and memory device sparing, this technique requires no additional memory storage overhead (other than ECC) and thus is less expensive.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the example embodiments of the subject matter described herein. It is intended that this subject matter be limited only by the claims, and the full scope of equivalents thereof.

Such embodiments of the subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments and other embodiments not specifically described herein will be apparent to those of skill in the art upon reviewing the above description.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims and the full range of equivalents to which such claims are entitled.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

The invention claimed is:

1. An apparatus comprising:
a random access memory device including a plurality of addressable memory locations;
a first memory manager coupled to the memory device, the first memory manager including an input queue operable to receive and store a plurality of requests from a processor for data to be read from memory locations in the memory device, wherein a memory manager transaction identifier (MMTID) is also stored with each stored request in the input queue that uniquely identifies the stored request; and
a scrub engine coupled to the first memory manager, wherein the scrub engine is operable to request data to be read from the memory device and to detect and correct single bit errors in the read data, and wherein the first memory manager further includes a scheduling unit operable:
to detect whether there is a multi-bit error in data read from a memory location in the memory device due to a data_read operation,
to perform a retry operation that includes up to N re-read operations of the data read operation that resulted in the detected multi-bit error, wherein the re-read operations continue up to N times as long as the data read from the first memory location includes detected multi-bit errors, in order to distinguish between an intermittent multi-bit error and a persistent multi-bit error,
to determine that the multi-bit error is an intermittent error if one of the re-read operations results in not having a detected multi-bit error, to determine that the multi-bit error is a persistent error if the re-read operations have occurred N times, where N is greater than one, and the data read on each of the N re-read operations has had a detected multi-bit error, and to log an address of the memory location associated with those multi-bit errors that are determined to be persistent multi-bit errors.

2. The apparatus of claim 1, further including a memory sequencer included in the first memory manager, the memory sequencer operable to reorder a scheduling of a re-reading of the data so that the re-reading of the data takes precedence over all other readings of data from at least a portion of the memory device associated with the first memory manager.

3. The apparatus of claim 2, further including arbitration logic included in the memory sequencer and operable to provide the re-reading of the data with precedence over all other reading of data from at least a portion of the memory device.

4. The apparatus of claim 1, wherein the first memory manager includes a retry counter operable to count the number of read operations that have been performed for a given retry operation.

5. The apparatus of claim 1, wherein the first memory manager includes a configuration table including a stored maximum retry counter value operable to indicate a value for a maximum number of times the re-read operations can be performed during a given retry operation.

6. The apparatus of claim 1, further including:
a spare bit mux included in the first memory manager and operable to provide a spare-bit insertion of a spare data bit to replace a bit in read data having a persistent single bit error.

7. The apparatus of claim 1, further including an atomic memory operation unit coupled to the first memory manager and operable to perform a read-modify-write operation on one or more memory locations included in the memory device.

8. The apparatus of claim 1, further including:
a plurality of subbanks coupled to the input queue, the subbanks operable to receive and store requests for data to be read from memory locations in the memory device.

9. The apparatus of claim 1, wherein, for the request for which the retry is being performed, the MMTID includes an indication that distinguishes the retry of the request from requests that are not retry operations.

10. A method comprising:
automatically cycling through a plurality of memory locations within a random access memory device using a scrub engine to obtain read data, and detecting and correcting single bit errors in the read data, wherein the plurality of memory locations includes a first memory location;
receiving and storing, in a first input queue, a plurality of requests from a processor for data to be read from one or more memory locations in the random access memory device, including storing a memory manager transaction identifier (MMTID) with each stored request in the first input queue, wherein the plurality of requests includes a first request for read data;
requesting, based on the first request, data be read from a memory location;
reading the data stored in the memory location;
detecting whether an error exists in the read data;
when a multi-bit error is detected by the detecting, initiating a retry operation, wherein the retry operation includes re-reading the data from the memory location up to N times and determining whether the multi-bit error is an intermittent multi-bit error or a persistent multi-bit error, wherein the determining that the multi-bit error is intermittent is based on one of the re-readings of data from the memory location resulting in not detecting a multi-bit error, wherein the determining that the multi-bit error is persistent is based on re-reading data from the memory location N times and detecting a multi-bit error on each of the N re-readings, and wherein N is an integer greater than one representing a maximum number of re-readings that may be performed during the retry operation; and logging an address of the memory location associated with those detected multi-bit errors that are determined to be persistent multi-bit errors.

11. The method of claim 10, further including:
when a single bit error is detected, correcting the single bit error in the read data; and
returning the corrected read data to a data requester.

12. The method of claim 10, wherein the determining of whether the multi-bit error is intermittent or persistent further includes:
when data read from the memory location on one of the re-readings does not include a multi-bit error, indicating that the memory location has an intermittent error and terminating the retry operation.

13. The method of claim 12, further including:
if the data read includes a single bit error, then correcting the single bit error; and returning the corrected data to a requester.

14. The method of claim 10, wherein detecting of whether an error exists includes:
detecting whether the error is a single bit error;
if the error is a single bit error, correcting the single bit error based on an error correction code and returning the corrected data to a requester.

15. A method comprising:
automatically cycling through a plurality of memory locations within a random access memory device using a scrub engine to obtain read data, and detecting and correcting single bit errors in the read data, wherein the plurality of memory locations includes a first memory location;
receiving and storing, in a first input queue, a plurality of requests from a processor for data to be read from one or more memory locations in the random access memory device, including storing a memory manager transaction identifier (MMTID) with each stored request in the first input queue;
at a given time, processing requests from both the processor and the scrub engine;
detecting a multi-bit error in data read from the first memory location;
re-reading the data from the first memory location up to N times as a result of the detected multi-bit error, wherein the re-reading includes detecting whether there are multi-bit errors in the data read during each re-reading of the data from the first memory location and wherein the re-reading continues up to N times as long as the data read from the first memory location includes detected multi-bit errors, in order to distinguish between intermittent multi-bit errors and persistent multi-bit errors;
determining that the multi-bit error is an intermittent error if one of the re-readings results in not detecting a multi-bit error; and
when re-reading occurred N times, where N is greater than one, and the data read on each of the N re-readings has had a detected multi-bit error, then indicating that the multi-bit error is a persistent error, and logging an address of the memory location associated with those multi-bit errors that are determined to be persistent multi-bit errors.

16. The method of claim 15, wherein automatically cycling occurs on a fixed time interval.

17. The method of claim 15, wherein automatically cycling occurs on a periodic schedule with an idle preference.

18. The method of claim 15, where automatically cycling occurs on a portion of the memory device that is idle.

19. The method of claim 15, wherein the determining that the multi-bit error is intermittent is based on detecting a single bit error during a re-reading of the data-from the first memory location.

20. The method of claim 15, wherein the determining that the multi-bit error is intermittent is based on detecting no error during a re-reading of the data-from the first memory location.

21. A system comprising:
a processor; and
an interface coupling the processor to a random access memory device, wherein the interface includes a plurality of memory managers, wherein each of the plurality of memory managers is associated with a different portion of the memory device, wherein at least one of the memory managers includes an input queue operable to receive and store a plurality of requests for data to be read from memory locations in the memory device, wherein a memory manager transaction identifier (MMTID) is also stored with each stored request in the input queue that uniquely identifies the stored request, and wherein the at least one of the memory managers includes further includes:
a scrub engine coupled to the interface, wherein the scrub engine is operable to request data to be read from the memory device and to detect and correct single bit errors in the read data; and
a scheduling unit that is operable:
to detect a multi-bit error in data read from a memory location in the memory device due to a data-read operation, and to perform a retry operation that includes up to N re-read operations to the memory location that resulted in the detected multi-bit error, wherein the re-read operations continue up to N times as long as the data read from the first memory location includes detected multi-bit errors, in order to distinguish between an intermittent multi-bit error and a persistent multi-bit error,
to determine that the multi-bit error is an intermittent error if one of the re-read operations results in not having a detected multi-bit error,
to determine that the multi-bit error is a persistent error if the re-read operations have occurred N times, where N is greater than one, and the data read on each of the N re-read operations has had a detected multi-bit error, and
to log an address of the memory location associated with those multi-bit errors that are determined to be persistent multi-bit errors.

22. The system of claim 21, wherein the processor includes a cache memory coupled to another cache memory included in at least one of the memory managers, the another cache memory operable to provide data read from the memory device to the cache memory included in the processor only when the read data does not include a multi-bit error.

23. The system of claim 21, wherein the processor is a multi-processor system.

24. The system of claim 21, wherein the scheduling unit further includes:
arbitration logic operable to reorder the requests provided by the scheduling unit to the memory device in order to give a read request associated with a retry operation precedence over other requests to read data.

25. The system of claim 21, further including:
an atomic memory operation unit coupled to at least one of the memory managers, the atomic memory operation unit operable to perform read-modify-write operation on one or more memory locations in the memory device.

26. The system of claim 21, wherein the memory device includes a dynamic random access memory.

27. The system of claim 21, wherein the memory device includes double-data-rate two synchronous dynamic random access memory.

28. A multiprocessor computer system, comprising:
a plurality of random access memory devices having a plurality of addressable memory locations;
a plurality of memory managers, each memory manager coupled to one or more of the memory devices, each of the plurality of memory managers including a respective input queue operable to receive and store a plurality of requests for data to be read from memory locations in the memory devices, wherein a memory manager transaction identifier (MMTID) is also stored with each stored request in the respective input queue that uniquely identifies the stored request, and each memory manager further including a scheduling unit operable:
to detect a multi-bit error in data read from a memory location in the coupled memory device due to a data-read operation, to perform a retry operation that includes up to N re-read operations to the memory location that resulted in the detected multi-bit error, wherein the re-read operations continue up to N times as long as the data read from the first memory location includes detected multi-bit errors, in order to distinguish between an intermittent multi-bit error and a persistent multi-bit error,
to determine that the multi-bit error is an intermittent error if one of the re-read operations results in not having a detected multi-bit error,
to determine that the multi-bit error is a persistent error if the re-read operations have occurred N times, where N is greater than one, and the data read on each of the N re-read operations has had a detected multi-bit error, and
to log an address of the memory location associated with those multi-bit errors that are determined to be persistent multi-bit errors.

* * * * *